(12) United States Patent
Hsueh et al.

(10) Patent No.: US 6,569,576 B1
(45) Date of Patent: May 27, 2003

(54) RETICLE COVER FOR PREVENTING ESD DAMAGE

(75) Inventors: Shih-Cheng Hsueh, Fremont, CA (US); Kevin T. Look, Fremont, CA (US); Jonathan Jung-Ching Ho, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 148 days.

(21) Appl. No.: 09/672,167

(22) Filed: Sep. 27, 2000

(51) Int. Cl.⁷ .............................. G03F 9/00; G03C 5/00
(52) U.S. Cl. ........................................ 430/5; 430/396
(58) Field of Search ...................... 430/5, 396; 378/34, 378/35; 428/14; 355/75

(56) References Cited

U.S. PATENT DOCUMENTS

| | | |
|---|---|---|
| 5,798,192 A | 8/1998 | King et al. |
| 5,989,754 A | 11/1999 | Chen et al. |
| 5,999,397 A | 12/1999 | Chen et al. |
| 6,291,114 B1 * | 9/2001 | Reijers .......................... 430/5 |
| 6,309,781 B1 * | 10/2001 | Gemmink et al. ............. 430/5 |

* cited by examiner

*Primary Examiner*—Mark F. Huff
*Assistant Examiner*—Saleha R. Mohamedulla
(74) *Attorney, Agent, or Firm*—Scott R. Brown; Arthur J. Behiel; Edel M. Young

(57) ABSTRACT

A reticle and pellicle that are modified to prevent ESD damage to the masking material between portions of the lithographic mask pattern on the reticle during an integrated circuit fabrication process. The modification involves providing conducting lines on the glass side of the reticle and on the surface of the pellicle to balance any buildup of electrostatic charges on those devices, thereby reducing or eliminating the induction of opposite charges onto adjacent mask pattern features on the reticle and preventing the melting and bridging of those mask pattern features and the defects caused by such melting or bridging. The conductive metal lines may have a smaller width than the smallest resolution value of the reduction lens used in the mask pattern transfer process, and may also be located outside of the focal plane of the reduction lens to avoid transfer of the images of the conductive lines onto the target semiconductor substrate during the mask pattern transfer process.

13 Claims, 2 Drawing Sheets

RETICLE COVER FOR PREVENTING ESD DAMAGE

FIELD OF THE INVENTION

The present invention relates to the fabrication of integrated circuits, and more particularly to reticles (masks) used during the fabrication of integrated circuits.

BACKGROUND

Integrated circuits (IC) typically comprise electronic circuitry made of individual devices that are coupled together to perform a certain function. To fabricate an IC that performs a function, a circuit schematic must be designed and then translated into a physical representation known as a layout using computer aided design (CAD) tools. The resulting layout is a translation of the discrete circuit elements of the circuit schematic into shapes that are used to construct individual physical components of the circuit such as gate electrodes, field oxidation regions, diffusion regions, and metal interconnections.

CAD tools that generate a layout are usually structured to function under a set of predetermined design rules in order to produce a functional circuit. These design rules are often determined by certain processing and design limitations defined by the particular IC fabrication process to be used, for example, defining the space tolerance between devices or interconnect lines that prevent undesirable interaction between devices or lines. Design rule limitations are frequently referred to as critical dimensions. A critical dimension of a circuit is commonly defined as the smallest width of a line or the smallest space between lines that can be supported by an IC fabrication process. Consequently, the critical dimension determines the overall size and density of the IC.

The layout is optically transferred onto a semiconductor substrate using a series of lithographic reticles and an exposure tool. Photolithography is a well-known process for transferring geometric shapes present on each reticle onto the surface of a semiconductor substrate (e.g., a silicon wafer) using the exposure tool including an ultra-violet (UV) or other light source. In the field of IC lithographic processing, a photo sensitive polymer film called photo resist is normally applied to the wafer and then allowed to dry. The exposure tool is utilized to expose the wafer with the proper geometrical mask patterns by transmitting UV light or other radiation through the reticles. After exposure, the wafer is treated to develop the mask images transferred to the photo sensitive material. These masking images are then used to create the device features of the circuit.

FIG. 1 is a perspective view showing a simplified conventional reticle 100 that is being used during the optical transfer of an integrated circuit portion onto a semiconductor substrate 110. Reticle 100 includes an opaque masking material (e.g., chrome) that is deposited on a transparent substrate 102 and etched to form a lithographic mask pattern 105. During an integrated circuit fabrication process, UV light or radiation emitted from an exposure tool (not shown) is transmitted through reticle 100, thereby forming an image 112 of mask pattern 105 on semiconductor substrate 110. As indicated by the tapered dashed lines in FIG. 1, the lithographic process typically utilizes an optical reduction system such that image 112 is substantially smaller than (e.g., ⅕th) the size of lithographic mask pattern 105. Note that the resolution values of mask pattern 105 are indicated as a width W of a mask pattern portion 106, and a space S between mask pattern portion 106 and mask portion 107. Width W and space S represent the smallest dimensions that can be repeatedly transferred onto semiconductor substrate 110 by the exposure tool, and produce structures meeting the critical dimensions defined by the IC fabrication process.

The reticle is protected on the side where the chrome pattern resides with a pellicle. The purpose of the pellicle is to prevent dust particles that may cause pattern defects from gathering on the reticle. Since the pellicle is transparent and the pellicle surface that collects dust particles is located outside of the focal plane of the reduction lens in the exposure tool, particles that accumulate on the pellicle will not form repeating defects on the semiconductor substrate 110. The reticle is also in contact with a pod, which holds the reticle in place during mask pattern transfer process. It has been found that electrostatic charge can accumulate on the pod and pellicle causing damage to the chrome pattern on the reticle. A damaged chrome pattern will be duplicated on the silicon substrate.

An important limiting characteristic of the exposure tool is its resolution value. The resolution value for an exposure tool is defined as the minimum mask pattern feature that the exposure tool can repeatedly expose onto the wafer.

Space S continues to decrease as improved stepper designs have allowed the resolution values of fabrication processes to decrease. Because the electrical field strength generated by the electrostatic charges on the adjacent patterns is inversely proportional to the pattern spacing, as the space S has decreased to sub-micron values, the probability of damage from electrostatic discharge has increased. FIG. 2 is a plan view showing a portion of reticle 100 in which some of the masking material has melted and formed a bridge 210 between mask pattern portions 106 and 107, thereby generating flaws in the IC formed on semiconductor substrate 110 (see FIG. 1). The combination of dissimilar charges stored in mask pattern portions 106 and 107 and the small space S separating these portions results in electrostatic discharge and melting of the masking material to form bridge 210.

U.S. Pat. No. 5,989,754 describes how accidental contact of the pod with a PVC glove causes electrostatic charges to form on the surface of the pod. The electrostatic charges are in turn induced onto the insulating surface of the reticle substrate and the chrome. U.S. Pat. No. 5,999,397 describes how to calculate the electrostatic charge potential on the reticle surface when a charge appears on the pod. Because the chrome patterns on the reticle are small, the charge per unit area can reach a critical value that will result in an electrostatic discharge damage to the chrome pattern such as the creation of bridge 210 between mask pattern portions 106 and 107 on FIG. 2. The prior art proposed forming a plurality of metal lines to connect all of the chrome patterns on the reticle substrate. The dimension of the metal lines is designed to be smaller than the minimum feature size that can be resolved by the reduction lens of the exposure tool so that the metal lines will not be duplicated on the silicon wafer substrate. The metal lines spread the induced charge across all of the chrome patterns on the reticle to reduce the charge per unit area on the chrome patterns below the critical value that results in electrostatic discharge damage to the chrome pattern. As a result, the induced charge will not concentrate on a few chrome islands and cause damage.

One potential problem with forming a plurality of metal lines to connect all of the chrome patterns arises in the mask inspection procedure. Typically, reticles are optically inspected using automated tools that compare the patterns on the reticle to the desired pattern established by the original design. This reticle inspection is carried out prior to using the reticle in the manufacturing process to avoid duplication of faulty patterns if the reticle was improperly manufactured. It is difficult during inspection to differentiate the intended pattern for the circuitry and the metal line patterns introduced to prevent electrostatic discharge, which may result in false detection of faults that do not exist.

Another problem with introducing a plurality of metal lines to connect the patterns and distribute electrostatic charge is that as technology advances, the packing of circuitry becomes more and more dense. A typical set of reticles used to manufacture a given IC can contain hundreds of millions of patterns. The cost associated with adding hundreds of millions of metal lines, having an even smaller feature size, to the desired pattern is not economical. Moreover, the intended patterns on the reticle are typically spaced apart in minimum spacing to insure the highest packing density. The effect of placing a grid of metal lines in the minimum space between the circuitry pattern is unknown. Given these densities, it is also difficult to guarantee all chrome patterns are interconnected throughout the reticle.

U.S. Pat. No. 5,798,192 proposed depositing a thin layer of conductive material over the chrome side of the reticle. The idea is similar to the grid of conducting metal lines, i.e., using the conductive layer to spread out the induced charge and reduce the charge per unit area on the chrome pattern of the reticle. The proposed thickness of the conductive layer needs to be thin so that it will not affect the transmittance of light through the reticle material. One problem associated with this approach as stated in U.S. Pat. No. 5,989,754, is that the proposed conductive layer thickness is hard to control uniformly across the reticle. Because deposit of the conductive layer is uneven, it may cause a large variation of transmittance of light across the reticle. For these and other reasons a new method of preventing the unwanted build-up of electrostatic charge on reticle mask patterns is desirable.

SUMMARY OF THE INVENTION

The present invention is directed to a pellicle and the glass side of a reticle, either or both of which may be modified to prevent bridging of the lithographic mask pattern material of the reticle between adjacent portions of the mask pattern during an IC fabrication process. As described above, this bridging effect is caused when dissimilar charges that are generated in adjacent mask pattern portions cause electrostatic discharge, which causes the masking material to melt and flow between the mask pattern portions. The present invention prevents bridging by either equalizing or minimizing these dissimilar charges, thereby reducing the potential between adjacent portions below that required to melt the masking material to form undesirable bridges. Accordingly, the present invention facilitates the development of fabrication processes that define ever smaller resolution values.

According to a first aspect of the invention, a protective conducting grid is deposited on the glass side of a reticle for use in a lithographic mask pattern transfer process, wherein the conductive grid conducts electrostatic charges throughout its constituent parts, thereby reducing the density of electrostatic charge induced on the mask pattern of the reticle.

According to a second aspect of the invention, a grid of conductive lines is deposited on a pellicle for use with the reticle, wherein the conductive lines conduct electrostatic charge throughout the grid, thereby reducing the density of electrostatic charge induced on the mask pattern of the reticle.

In a third separate aspect of the invention, the conductive lines on both the glass side of the reticle and on the pellicle are formed so that the feature width of the lines is smaller than the resolution limit of the reduction lens used in an exposure tool. Consequently, the pattern formed by the conductive lines is not transferred by the mask pattern transfer system onto the substrate that receives the mask pattern from the reticle.

In a fourth separate aspect of the invention, the conductive metal lines on the glass side of the reticle are deposited so that they appear outside the focal plane of the exposure tool reduction lens during the lithographic mask pattern transfer process. Likewise, the conductive lines on the pellicle are deposited so that they appear outside the focal plane of the exposure tool reduction lens during the lithographic mask pattern transfer process. By depositing the conductive lines so that they appear outside the focal plane of the reduction lens during the mask transfer process, the lines do not get transferred onto the target semiconductor substrate.

In a fifth separate aspect of the invention, a thin conductive film, capable of transmitting light in a lithographic mask pattern transfer process, may be deposited on either the glass side of a reticle or on a pellicle. The conductive thin film layer prevents bridging as described above by minimizing the induction of opposite electrostatic charges on adjacent mask pattern portions, thereby preventing bridging of mask pattern material causing defects. Depositing a thin film rather than forming conductive lines has the advantage of simplicity. Forming conductive lines requires first depositing the conductor, for example chrome, then adding and patterning photoresist, then etching away the conductor to leave the conductive lines. By contrast, a conductive film can be deposited in a single step. Placing the thin film out of the focal plane of the mask lines minimizes the impact on image sharpness of any defects in the thin film.

DETAILED DESCRIPTION

Figure 1:
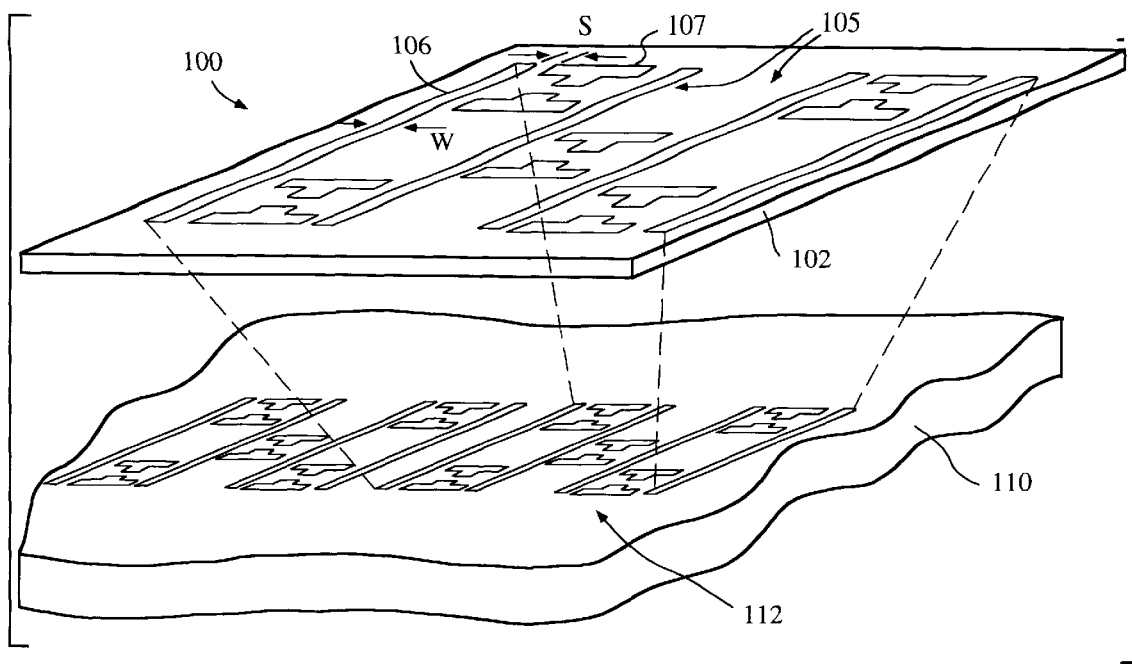
FIG. 1 is a perspective view showing a conventional reticle and a semiconductor substrate.
Figure 2:
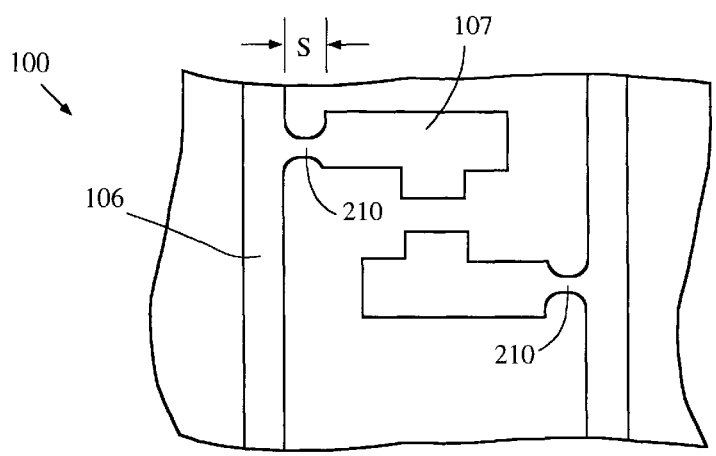
FIG. 2 is a plan view showing a portion of the conventional reticle after mask damage caused by electrostatic discharge.

The present invention is directed to a reticle that is modified to prevent bridging of the masking material (e.g., chrome) between adjacent portions of the lithographic mask pattern during an IC fabrication process. Evidence shows that this bridging may be due to electrostatic discharge (ESD), which is caused by a combination of dissimilar charges stored on the adjacent pattern portions 106 and 107 of the mask pattern 100, and the relatively small space separating those adjacent portions (FIG. 1). These dissimilar charges may be generated by the rapid movement of reticle 100 by, for example, a stepper apparatus. These dissimilar charges may also be generated by contact with the reticle by a PVC glove. The modifications provided in accordance with the present invention address the bridging problem by minimizing the induction of these dissimilar charges onto the mask pattern, thereby reducing the potential between adjacent portions below that required to generate the masking material bridging problem.

As used herein, the term "sub-resolution" refers to a mask feature size that is less than the resolution value of an exposure tool used to form an IC during a fabrication process. By definition, a sub-resolution feature is not transferred onto a semiconductor substrate during a lithographic process of the fabrication process that uses the reticle upon which the sub-resolution feature is formed. Accordingly, a sub-resolution wire is a wire formed on a reticle that has a width less than the resolution value defined by the fabrication process in which the reticle is intended to be used.

As used herein, the term "focal plane" refers to the plane occupied by the mask pattern that is focused on by the reduction lens during the lithographic mask pattern transfer process. Thus, a feature located outside the focal plane is distant enough from the object plane mask surface to sufficiently defocus the image of the feature at the target semiconductor substrate.

Figure 3:
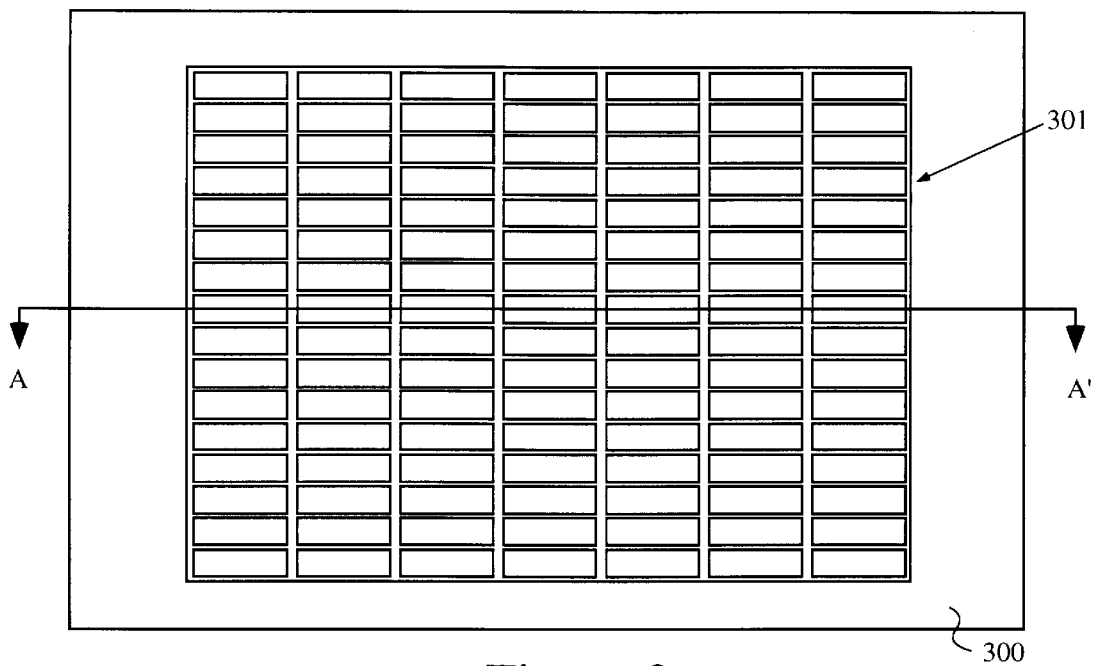
FIG. 3 is a plan view showing the glass side of a reticle or a pellicle having a grid of conductive lines deposited thereon.

FIG. 3 is a plan view showing a reticle 300 formed in accordance with a first embodiment of the present invention. Reticle 300 includes a transparent substrate (e.g., quartz) having a grid of conductive lines 301 formed thereon. Although an orthogonal grid of lines is depicted in FIG. 3, the lines may be of any pattern so long as they conduct with each other and are deposited over a substantial portion of the reticle. The mask pattern information to be transferred to a target semiconductor substrate is formed on the opposite side of the reticle than that shown in FIG. 3. The grid of conductive lines may be made of any conducting material (e.g., chrome) that is etched or deposited using known techniques. In a preferred embodiment, the conductive lines that form the grid are made of sub-resolution wires that are electrically connected to each other. Because the width of each sub-resolution wire is less than the resolution value defined by the fabrication process, none of the sub-resolution wires are optically transferred onto the target semiconductor substrate. A similar grid of conductive lines is etched or deposited onto a pellicle. FIG. 3 also equally shows the grid pattern that would be seen on the pellicle. As with the pattern on the reticle, an orthogonal grid of conducting lines is not required on the pellicle.

Figure 4:
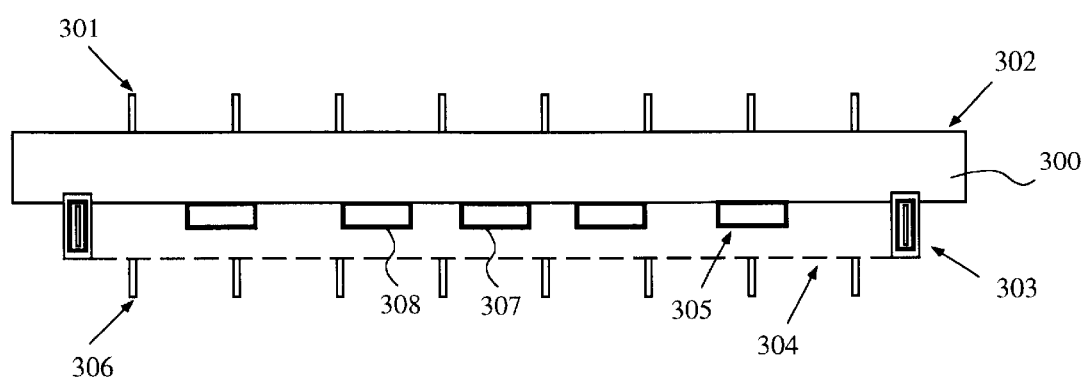
FIG. 4 is a cross-sectional view including a reticle and pellicle formed in accordance with a first embodiment of the present invention.

FIG. 4 is a cross-sectional view of the reticle of FIG. 3 taken along line AA'. The glass side of the reticle 302, shown at the top of FIG. 4, has conductive lines 301 deposited on it. The reticle 300 is made of a translucent substrate and has an opaque mask pattern 305, shown in cross-section, deposited on it. The mask pattern 305 is positioned in the focal plane of the reduction lens during the mask pattern transfer process. The conductive lines 301 on reticle 300 are positioned outside of the focal plane of the reduction lens during the mask pattern transfer process. Also shown is the supporting frame 303 for the pellicle and the pellicle surface 304 upon which a second grid of conductive lines 306, shown in cross-section, is deposited or etched. The conductive lines 306 on pellicle surface 304 are positioned outside of the focal plane of the reduction lens during the mask pattern transfer process. Because the conductive lines on the reticle and pellicle are positioned outside of the reduction lens focal plane during the mask pattern transfer process, they will not be transferred to the target semiconductor substrate and cause defects in the manufacturing process.

As discussed above, bridging of the mask material between adjacent mask pattern portions in conventional reticles is caused by dissimilar charges that are built up during a fabrication process. In accordance with the preferred embodiment, the sub-resolution wires conduct electrostatic charges thereby balancing the dissimilar charges. For example, when dissimilar charges are generated on the reticle conductive grid 301, a current is generated in the sub-resolution wires of that grid. This current discharges the more positive of the two dissimilar charges stored on one portion of the grid to the more negative charge stored on a different portion of the grid until these charges are balanced. In like manner, any electrostatic charge buildup on the pellicle is balanced by conducting the charges on conduction grid 306. By balancing the dissimilar charges on the glass side of the reticle and on the pellicle, the invention prevents the induction of dissimilar charges onto adjacent mask pattern portions (e.g., 307 and 308) on the reticle. By preventing the buildup of dissimilar charges on the mask pattern portions of the reticle, the invention prevents bridging of the masking material between those adjacent mask pattern portions, thereby facilitating the development of fabrication processes that define ever-smaller resolution values and critical dimensions.

In another embodiment, instead of conductive lines, a thin conductive film layer may be deposited on the glass side of the reticle or on the pellicle. This would achieve the result of equalizing electrostatic charges built up on the reticle or pellicle in the same way as the conductive lines described above.

As suggested above, in addition to the specific embodiments disclosed herein, other modifications to conventional reticles and pellicles are also possible that fall within the spirit and scope of the present invention. Therefore, the invention is limited only by the following claims.

What is claimed is:

1. A lithographic mask pattern transfer assembly for use with an exposure tool reduction lens comprising:

a reticle having a mask pattern formed on a first side of the reticle, and a plurality of conductive lines formed on a second side of the reticle for reducing electrostatic charge density induced on the reticle.

2. A lithographic mask pattern transfer assembly for use with an exposure tool reduction lens comprising:

a pellicle having a plurality of conductive lines formed thereon for reducing electrostatic charge density induced on the pellicle.

3. The lithographic mask pattern transfer assembly for use with an exposure tool reduction lens of claim 1 wherein the plurality of conductive lines comprise chrome.

4. The lithographic mask pattern transfer assembly for use with an exposure tool reduction lens of claim 2 wherein the plurality of conductive lines comprise chrome.

5. The lithographic mask pattern transfer assembly for use with an exposure tool reduction lens of claim 1 wherein the plurality of conductive lines are located outside of the focal plane of the reduction lens.

6. The lithographic mask pattern transfer assembly for use with an exposure tool reduction lens of claim 2 wherein the plurality of conductive lines are located outside of the focal plane of the reduction lens.

7. The lithographic mask pattern transfer assembly for use with an exposure tool reduction lens of claim 1 wherein the width of the plurality of conductive lines is smaller than the resolution limit of the reduction lens.

8. The lithographic mask pattern transfer assembly for use with an exposure tool reduction lens of claim 2 wherein the width of the plurality of conductive lines is smaller than the resolution limit of the reduction lens.

9. A method of reducing damage caused by electrostatic discharge to the mask patterns formed on a reticle used in a lithographic mask pattern transfer process comprising:

providing an exposure tool having a reduction lens;

providing a reticle having a mask pattern formed on a first side of the reticle and a first plurality of conductive lines formed on a second side of the reticle; and shining radiation through the reticle to transfer the mask pattern formed on the first side of the reticle to a substrate.

10. The method of claim 9 comprising the further step of providing a pellicle having a second plurality of conductive lines.

11. The method of claim 10 wherein the first and second plurality of conductive lines comprise chrome.

12. The method of claim 10 wherein the reduction lens has a focal plane and said first and second plurality of conductive lines are located outside of the focal plane of the reduction lens.

13. The method of claim 10 wherein the first and second plurality of conductive lines are comprised of lines having a width less than the resolution limit of the reduction lens.

* * * * *